United States Patent
Lee et al.

(10) Patent No.: US 11,730,034 B2
(45) Date of Patent: Aug. 15, 2023

(54) ORGANIC LIGHT EMITTING DISPLAY DEVICE HAVING EMISSION AREA AND NON_EMISSION AREA FOR EACH OF THE PLURALITY OF SUB-PIXELS

(71) Applicant: LG Display Co., Ltd., Seoul (KR)

(72) Inventors: HakMin Lee, Yongin-si (KR); HeeJin Kim, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 265 days.

(21) Appl. No.: 17/134,068

(22) Filed: Dec. 24, 2020

(65) Prior Publication Data

US 2021/0202608 A1 Jul. 1, 2021

(30) Foreign Application Priority Data

Dec. 31, 2019 (KR) .................. 10-2019-0179896

(51) Int. Cl.
| | |
|---|---|
| *H01L 29/08* | (2006.01) |
| *H10K 59/35* | (2023.01) |
| *H10K 50/814* | (2023.01) |
| *H10K 50/824* | (2023.01) |
| *H10K 59/122* | (2023.01) |
| *H10K 59/131* | (2023.01) |

(52) U.S. Cl.
CPC ......... *H10K 59/353* (2023.02); *H10K 50/814* (2023.02); *H10K 50/824* (2023.02); *H10K 59/122* (2023.02); *H10K 59/131* (2023.02)

(58) Field of Classification Search
CPC ............. H01L 27/3218; H01L 27/3246; H01L 27/3276; H01L 51/5212; H01L 51/5226
USPC .......................................................... 257/40
See application file for complete search history.

(56) References Cited

U.S. PATENT DOCUMENTS

| | | | |
|---|---|---|---|
| 2006/0170712 A1* | 8/2006 | Miller ................. | H01L 27/3211 |
| | | | 345/695 |
| 2017/0092705 A1* | 3/2017 | Lim ...................... | H01L 27/326 |
| 2017/0162638 A1* | 6/2017 | Nendai .................... | H01L 51/56 |
| 2017/0193898 A1* | 7/2017 | Lee ...................... | H01L 27/3218 |
| 2018/0182989 A1* | 6/2018 | Paek ...................... | H01L 51/5012 |
| 2018/0197924 A1* | 7/2018 | Tada ..................... | G06F 3/0446 |
| 2018/0233547 A1* | 8/2018 | Chung ................ | H01L 27/3258 |
| 2019/0252469 A1* | 8/2019 | Xiao ..................... | H01L 27/326 |

* cited by examiner

*Primary Examiner* — Phuc T Dang
(74) *Attorney, Agent, or Firm* — Fenwick & West LLP

(57) ABSTRACT

Provided is an organic light emitting display device. The organic light emitting display device includes a plurality of sub-pixels, an anode disposed in each of the plurality of sub-pixels, a bank layer covering an edge of the anode and defining emission areas, an organic emission layer disposed on the anode, and a cathode disposed on the organic emission layer. Each of sub-pixels includes a respective one of the emission areas and a respective non-emission area. A minor axis length of the emission area in the first sub-pixel, that of the emission area in the second sub-pixel and that of the emission area in the third sub-pixel are identical to each other. A major axis length of the emission area in the first sub-pixel, that of the emission area in the second sub-pixel and that of the emission area in the third sub-pixel are different from each other.

14 Claims, 10 Drawing Sheets

ORGANIC LIGHT EMITTING DISPLAY DEVICE HAVING EMISSION AREA AND NON_EMISSION AREA FOR EACH OF THE PLURALITY OF SUB-PIXELS

CROSS-REFERENCE TO RELATED APPLICATIONS

This application claims the priority of Republic of Korea Patent Application No. 10-2019-0179896 filed on Dec. 31, 2019 with the Korean Intellectual Property Office, the disclosure of which is incorporated herein by reference.

BACKGROUND

Field

The present disclosure relates to an organic light emitting display device and more particularly, to an organic light emitting display device which is improved in display quality by reducing color mixing of inks and thickness deviation of an organic emission layer when the organic emission layer is formed through a solution process.

Description of Related Art

As the information age advances, the field of a display device for visually displaying electrical information signals has grown rapidly. Accordingly, various studies on display devices are ongoing to improve the performance such as thinning, weight lightening, and low power consumption.

Among various display devices, an organic light emitting display device is a self-light emitting display device and does not need a separate light source unlike a liquid crystal display device. Thus, the organic light emitting display device can be manufactured into a lightweight and thin form. Further, the organic light emitting display device is advantageous in terms of power consumption since it is driven with a low voltage. Also, the organic light emitting display device has excellent color expression ability, a high response time, a wide viewing angle, and a high contrast ratio (CR). Therefore, the organic light emitting display device is expected to be applied to various fields.

SUMMARY

As for a conventional organic light emitting display device, a fine metal mask (FMM) is used when an organic emission layer is formed in each sub-pixel. However, it is difficult to apply the FMM to a large-area or high-resolution display device due to a fabrication tolerance, sagging and a shadow effect of the mask. Particularly, as demands for large area and high resolution increase, the gap between openings of the FMM needs to be reduced. During a manufacturing process of the organic light emitting display device, the openings may be clogged by an organic material or metals defining the openings may stick together. Also, a mechanical strength of the mask may not be maintained.

In order to solve these problems, the inventors of the present disclosure have proposed a method for forming an organic emission layer through a solution process of dropping ink containing a luminous material to an emission area. In the solution process, a bank defining an emission area and a non-emission area is formed on an anode. Then, an injector scans and injects ink to the emission area and hardens the injected ink to form an organic emission layer.

Accordingly, an object to be achieved by the present disclosure is to provide an organic light emitting display device in which color mixing of inks occurring when an organic emission layer is formed through a solution process can be solved.

Another object to be achieved by the present disclosure is to provide an organic light emitting display device which is improved in display quality by reducing or minimizing thickness deviation of an organic emission layer.

Yet another object to be achieved by the present disclosure is to provide an organic light emitting display device which has high resolution by reducing or minimizing a non-emission area inside a sub-pixel.

Objects of the present disclosure are not limited to the above-mentioned objects, and other objects, which are not mentioned above, can be clearly understood by those skilled in the art from the following descriptions.

According to an aspect of the present disclosure, an organic light emitting display device is provided. The organic light emitting display device includes a plurality of sub-pixels including a first sub-pixel, a second sub-pixel and a third sub-pixel. The organic light emitting display device also includes an anode disposed in each of the plurality of sub-pixels and a bank layer covering an edge of the anode and defining emission areas. The organic light emitting display device further includes an organic emission layer disposed on the anode and a cathode disposed on the organic emission layer. Each of the first sub-pixel, the second sub-pixel and the third sub-pixel includes a respective one of the emission areas and a respective non-emission area. A minor axis length of the emission area in the first sub-pixel, a minor axis length of the emission area in the second sub-pixel and a minor axis length of the emission area in the third sub-pixel are identical to each other. A major axis length of the emission area in the first sub-pixel, a major axis length of the emission area in the second sub-pixel and a major axis length of the emission area in the third sub-pixel are different from each other.

Other detailed matters of the exemplary embodiments are included in the detailed description and the drawings.

According to the present disclosure, it is possible to provide an organic light emitting display device in which an organic emission layer is distributed uniformly.

According to the present disclosure, it is possible to provide a structure capable of reducing or minimizing the amount of ink used when an organic light emitting display device is manufactured through a solution process.

According to the present disclosure, it is possible to provide an organic light emitting display device which has high resolution by reducing or minimizing a non-emission area inside a sub-pixel.

According to the present disclosure, it is possible to reduce or minimize defects due to deterioration by maximizing the size of a contact area between a cathode and a low-potential voltage line.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
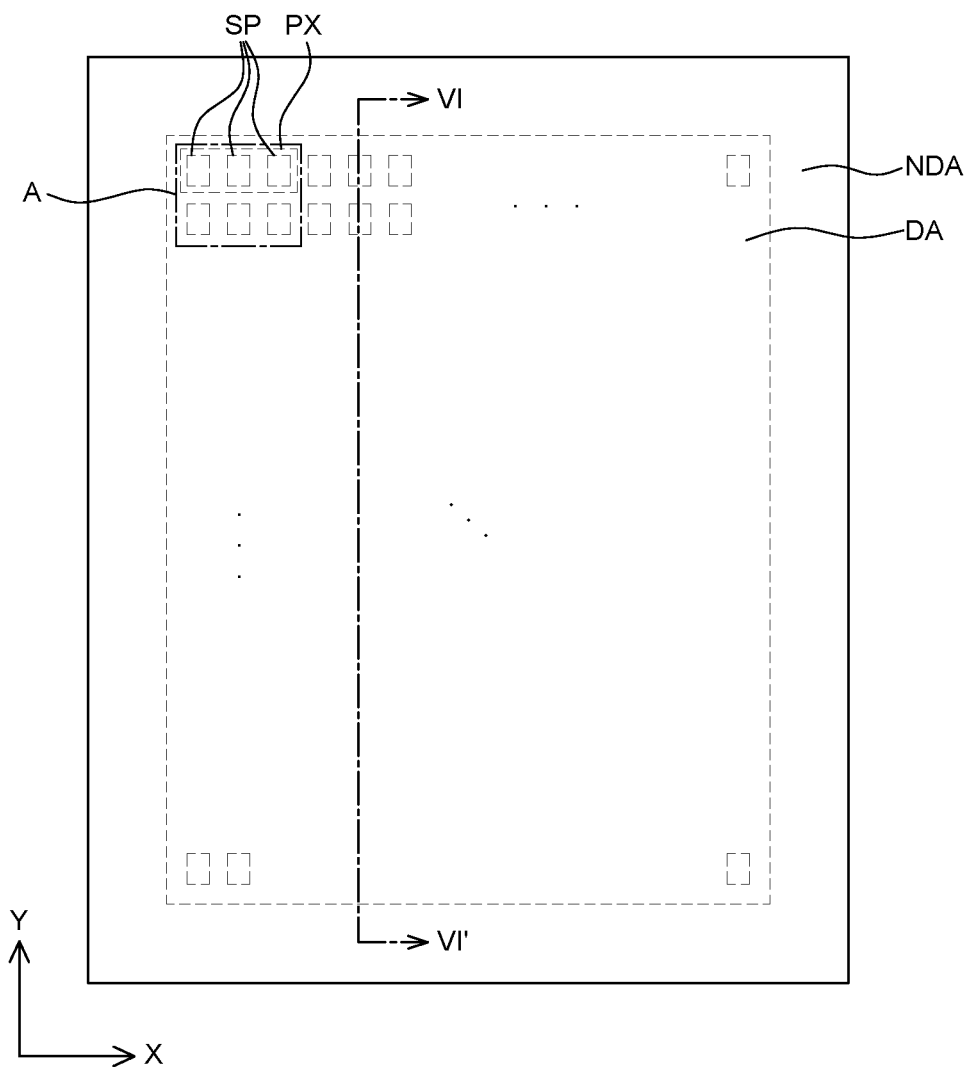
FIG. 1 is a plan view of an organic light emitting display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, an organic light emitting display device according to exemplary embodiments of the present disclosure will be described in detail with reference to accompanying drawings.

Figure 2:
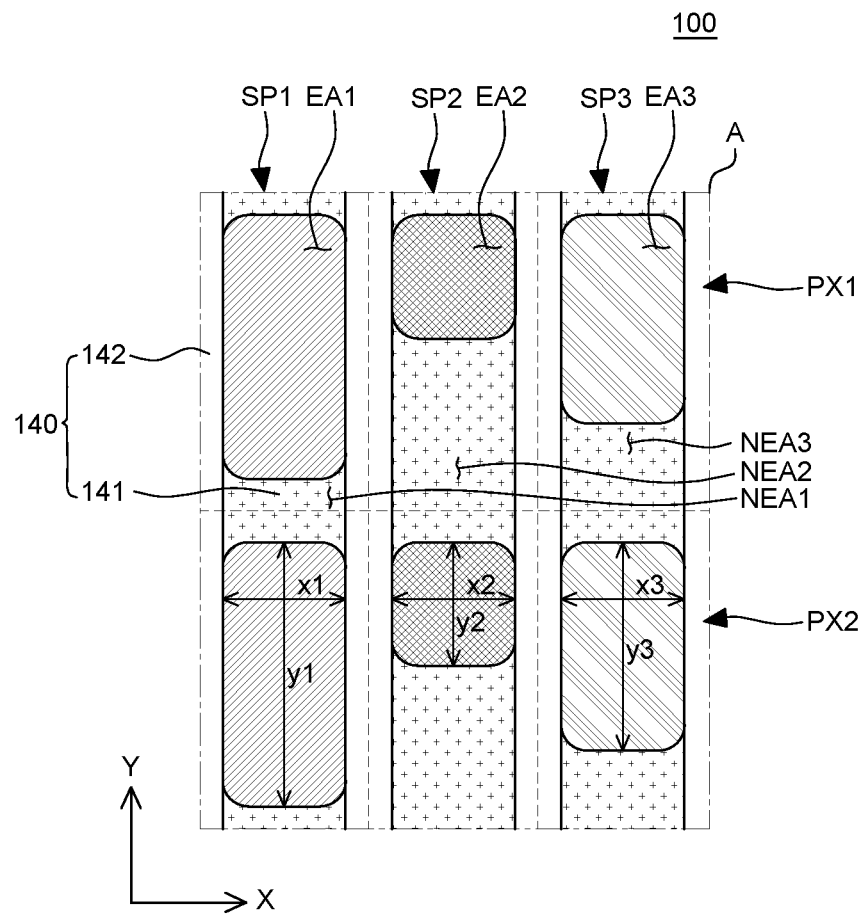
FIG. 2 is a schematic enlarged plan view of an area A of FIG. 1 according to an embodiment of the present disclosure.
Figure 3:
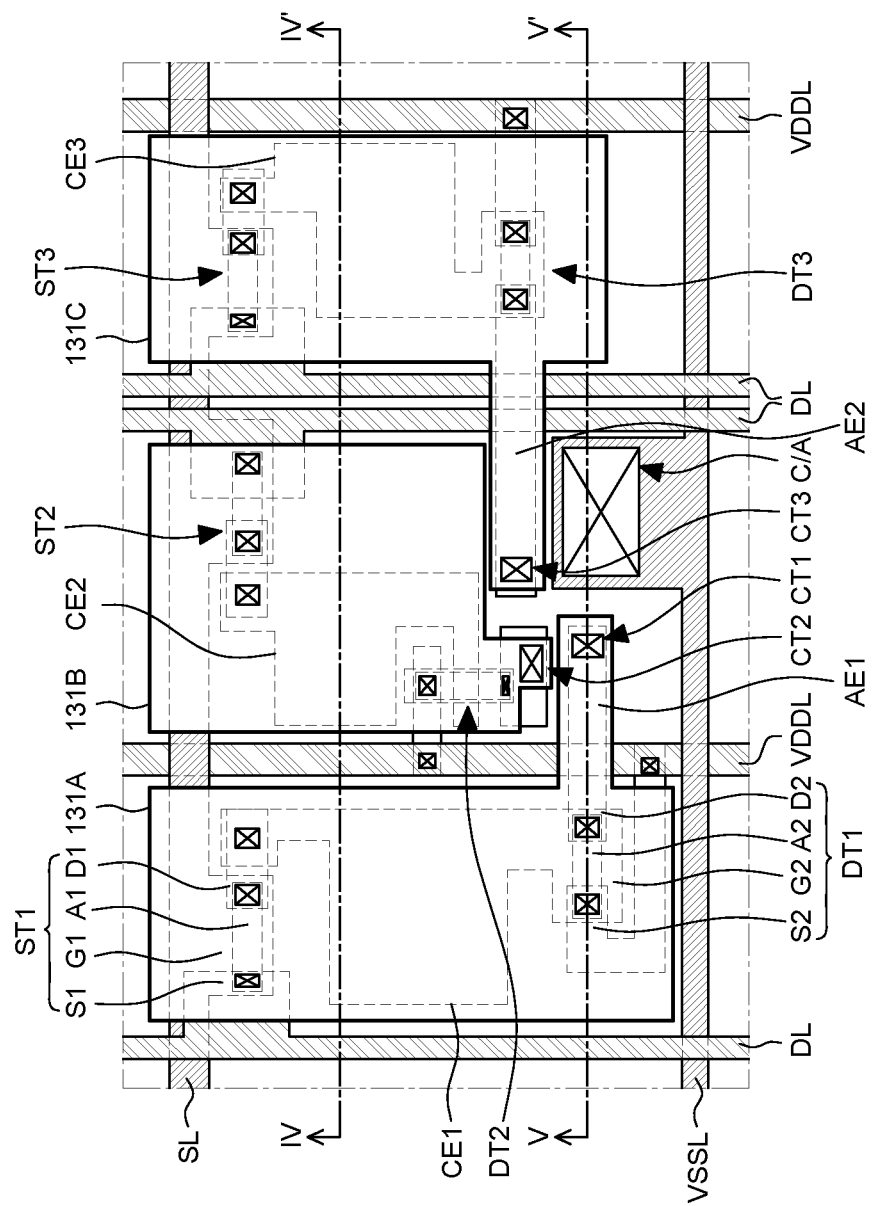
FIG. 3 is an enlarged plan view of a first pixel PX1 of FIG. 2 according to an embodiment of the present disclosure.
Figure 4:
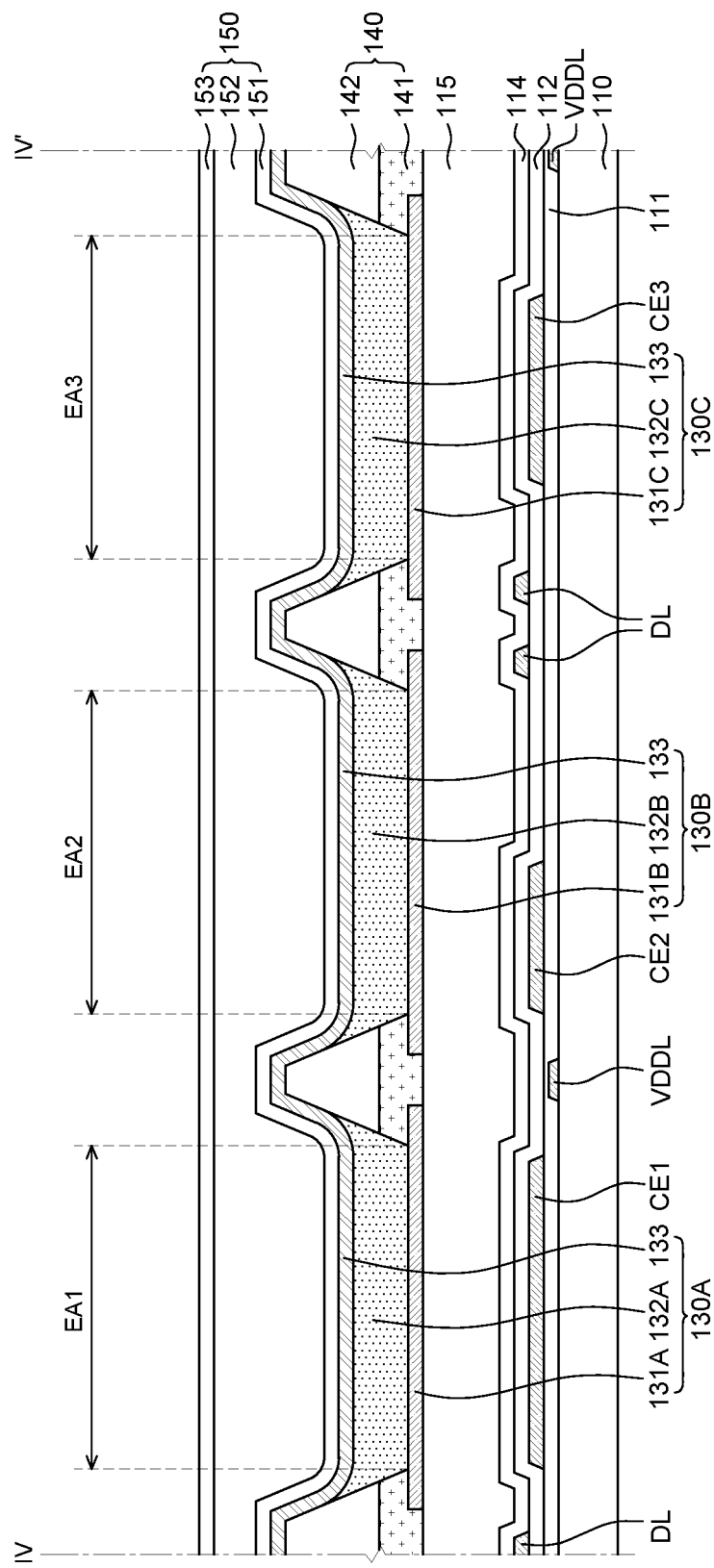
FIG. 4 is a cross-sectional view of the organic light emitting display device as taken along a line IV-IV' of FIG. 3 according to an embodiment of the present disclosure.
Figure 5:
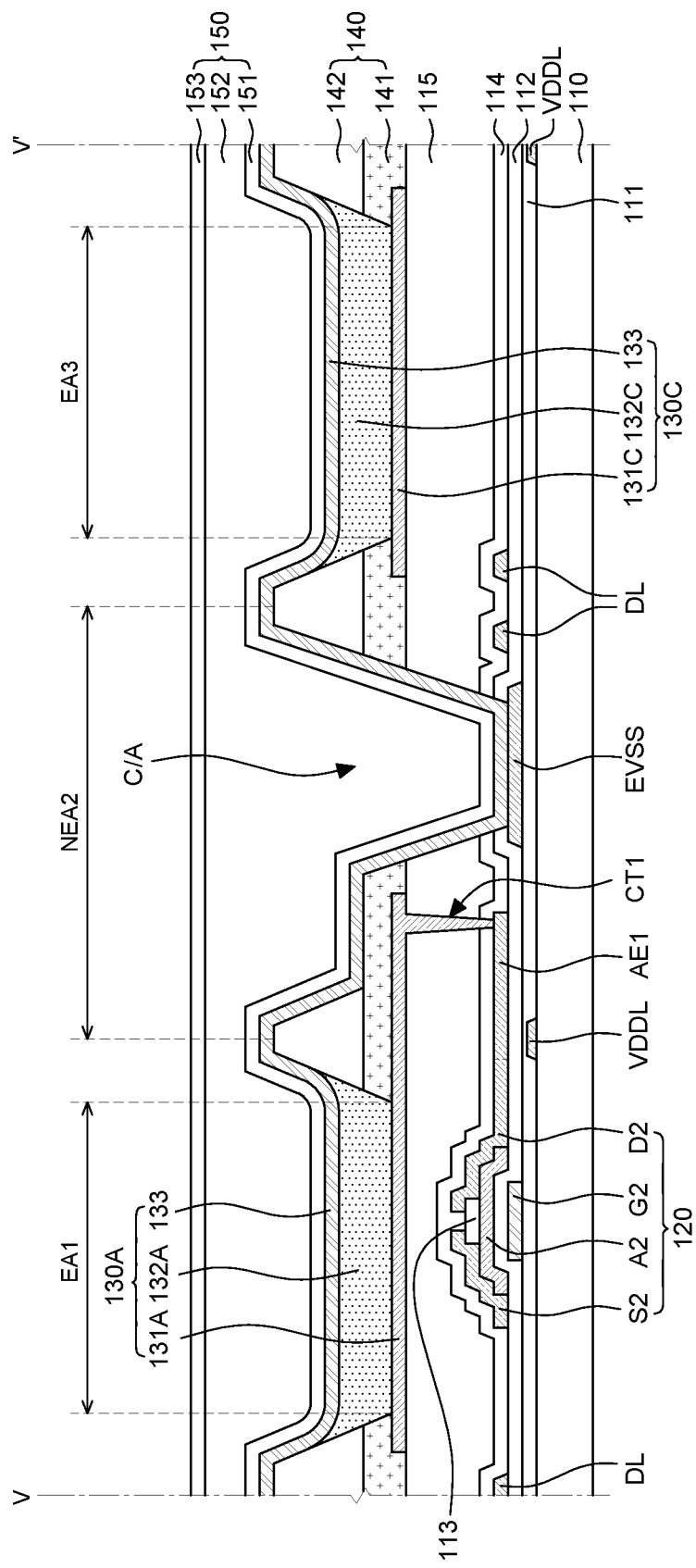
FIG. 5 is a cross-sectional view of the organic light emitting display device as taken along a line V-V' of FIG. 3 according to an embodiment of the present disclosure.
Figure 6:
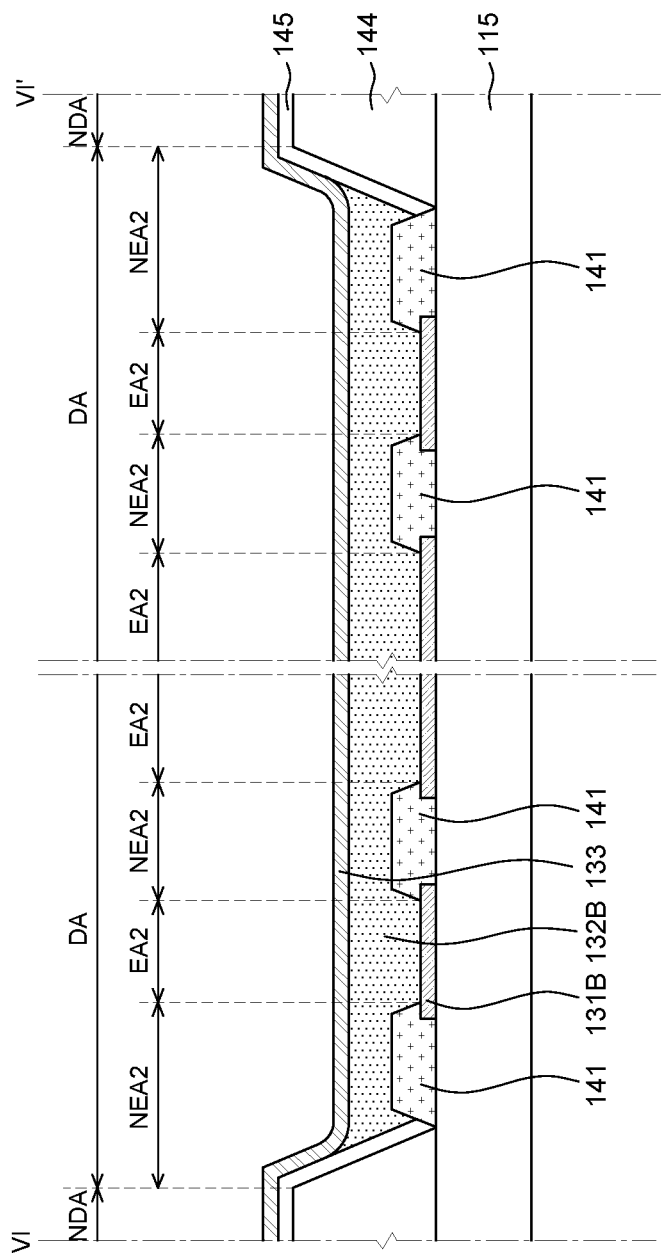
FIG. 6 is a cross-sectional view of the organic light emitting display device as taken along a line VI-VI' of FIG. 1 according to an embodiment of the present disclosure.

FIG. 1 through FIG. 6 are views provided to explain an organic light emitting display device according to an exemplary embodiment of the present disclosure. FIG. 1 is a plan view of the organic light emitting display device according to an exemplary embodiment of the present disclosure. FIG. 2 is a schematic enlarged plan view of an area A of FIG. 1 according to an embodiment of the present disclosure. FIG. 3 is an enlarged plan view of a first pixel PX1 of FIG. 2 according to an embodiment of the present disclosure. FIG. 4 is a cross-sectional view of the organic light emitting display device as taken along a line IV-IV' of FIG. 3 according to an embodiment of the present disclosure. FIG. 5 is a cross-sectional view of the organic light emitting display device as taken along a line V-V' of FIG. 3 according to an embodiment of the present disclosure. FIG. 6 is a cross-sectional view of the organic light emitting display device as taken along a line VI-VI' of FIG. 1 according to an embodiment of the present disclosure.

Referring to FIG. 1, an organic light emitting display device 100 according to an exemplary embodiment of the present disclosure includes a display area DA and a non-display area NDA. The display area DA is an area in which a plurality of pixels PX is disposed and an image is displayed. In the display area DA, pixels PX including an emission area for displaying an image and driving circuits for driving the pixels PX may be disposed. The non-display area NDA is an area which surrounds the display area DA and in which an image is not displayed. In the non-display area NDA, various lines, driver ICs and printed circuit boards for driving the pixels and driving circuits disposed in the display area DA are disposed. For example, various ICs such as a gate driver IC and a data driver IC may be disposed in the non-display area NDA. As described above, the driver ICs and the printed circuit boards may be disposed in the non-display area NDA, and the non-display area NDA needs a predetermined region where the driver ICs and the printed circuit boards are disposed.

The plurality of pixels PX is arranged in a matrix form and each of the plurality of pixels PX includes a plurality of sub-pixels SP. The sub-pixels are elements for displaying one color. The sub-pixels may be defined by intersection of a plurality of gate lines disposed in a first direction and a plurality of data lines DL disposed in a second direction different from the first direction. Herein, the first direction may be a horizontal direction or a minor axis direction of FIG. 1, and the second direction may be a vertical direction or a major axis direction of FIG. 1, but are not limited thereto.

FIG. 1 illustrates that each of the plurality of sub-pixels SP has a rectangular shape, but the shape of each sub-pixel SP is not limited thereto. Each sub-pixel SP may have various shapes, such as a circular shape, an oval shape or a polygonal shape other than the rectangular shape.

Referring to FIG. 2, each pixel PX includes a first sub-pixel SP1, a second sub-pixel SP2 and a third sub-pixel SP3. For example, the first sub-pixel SP1, the second sub-pixel SP2 and the third sub-pixel SP3 may be arranged sequentially in the first direction (horizontal direction), but are not limited thereto. Herein, each of the first sub-pixel SP1, the second sub-pixel SP2 and the third sub-pixel SP3 may be arranged repeatedly in the second direction (vertical direction). That is, the first sub-pixel SP1 is arranged repeatedly in the second direction (vertical direction) and the second sub-pixel SP2 is arranged repeatedly in the second direction (vertical direction). Also, the third sub-pixel SP3 is arranged repeatedly in the second direction (vertical direction). Thus, sub-pixels SP emitting the same color may be arranged repeatedly in the second direction.

The first sub-pixel SP1, the second sub-pixel SP2 and the third sub-pixel SP3 may display different colors, respectively, or some of the sub-pixels SP may display the same color if necessary. Each of the first sub-pixel SP1, the second sub-pixel SP2 and the third sub-pixel SP3 may be any one of a red sub-pixel, a green sub-pixel, a blue sub-pixel and a white sub-pixel. The layout and sequence of the sub-pixels illustrated in FIG. 1 are examples but are not limited thereto.

Referring to FIG. 2, the sub-pixels SP1, SP2 and SP3 include respective emission areas EA1, EA2 and EA3 and respective non-emission areas NEA1, NEA2 and NEA3. The emission areas EA1, EA2 and EA3 emit light for displaying an image. In the emission areas EA1, EA2 and EA3, organic light emitting elements are formed.

Referring to FIG. 2, the emission area EA1 of the first sub-pixel SP1, the emission area EA2 of the second sub-pixel SP2 and the emission area EA3 of the third sub-pixel SP3 are arranged in the first direction (horizontal direction). Each of the emission area EA1 of the first sub-pixel SP1, the emission area EA2 of the second sub-pixel SP2 and the emission area EA3 of the third sub-pixel SP3 may have a rectangular shape with rounded edges, but is not limited thereto.

Referring to FIG. 2, a minor axis length x1 of the emission area EA1 in the first sub-pixel SP1, a minor axis length x2 of the emission area EA2 in the second sub-pixel SP2 and a minor axis length x3 of the emission area EA3 in the third sub-pixel SP3 are identical to each other. However, a major axis length y1 of the emission area EA1 in the first sub-pixel SP1, a major axis length y2 of the emission area EA2 in the second sub-pixel SP2 and a major axis length y3 of the emission area EA3 in the third sub-pixel SP3 are different from each other.

Herein, the term "major axis" refers to a direction along a longer side of a rectangular emission area of a sub-pixel and the term "minor axis" refers to a direction along a shorter side of the rectangular emission area of the sub-pixel. Referring to FIG. 2, the major axis refers to the second direction (Y-axis direction) and the minor axis refers to the first direction (X-axis direction), but are not limited thereto.

In the organic light emitting display device 100 according to an exemplary embodiment of the present disclosure, the first sub-pixel SP1 may be a blue sub-pixel, the second sub-pixel SP2 may be a red sub-pixel and the third sub-pixel SP3 may be a green sub-pixel. In this case, the respective minor axis lengths x1, x2 and x3 of the emission areas EA1, EA2 and EA3 in the first sub-pixel SP1, the second sub-pixel SP2 and the third sub-pixel SP3 are set to be identical to each other. Also, the major axis lengths y1, y2 and y3 thereof are set to be different from each other. Thus, it is possible to control the size of the emission area EA1 in the first sub-pixel SP1, the size of the emission area EA2 in the second sub-pixel SP2 and the size of the emission area EA3 in the third sub-pixel SP3 to be different from each other. Specifically, the major axis length y2 of the emission area EA2 in the second sub-pixel SP2 which is a red sub-pixel may be shorter than the major axis length y1 of the emission area EA1 in the first sub-pixel SP1 which is a blue sub-pixel and the major axis length y3 of the emission area EA3 in the third sub-pixel SP3 which is a green sub-pixel. More specifically, the major axis length y2 of the emission area EA2 in the second sub-pixel SP2 which is a red sub-pixel may be the shortest and the major axis length y1 of the emission area EA1 in the first sub-pixel SP1 which is a blue sub-pixel may be the longest. Due to differences among the major axis lengths y1, y2 and y3, the emission area EA2 of the second sub-pixel SP2 which is a red sub-pixel may be designed to have the smallest size and the emission area EA1 of the first sub-pixel SP1 which is a blue sub-pixel may be designed to have the largest size. In general, the blue emission efficiency may be the lowest and the red emission efficiency may be the highest. Therefore, in the organic light emitting display device illustrated in FIG. 2, the major axis length y1 of the emission area EA1 in the first sub-pixel SP1 which is a blue sub-pixel is set to be the longest and the major axis length y2 of the emission area EA2 in the second sub-pixel SP2 which is a red sub-pixel is set to be the shortest. Thus, the emission area EA1 of the first sub-pixel SP1 may have the largest size. As a result, the emission efficiency of a blue emission layer may be improved.

Meanwhile, referring to FIG. 4, the emission areas EA1, EA2 and EA3 in the first sub-pixel SP1, the second sub-pixel SP2 and the third sub-pixel SP3 include organic emission layers 132A, 132B and 132C, respectively. Each of the organic emission layers 132A, 132B and 132C may be formed through a solution process such as inkjet printing or nozzle printing. When the organic emission layers 132A, 132B and 132C are formed in the respective sub-pixels SP1, SP2 and SP3 through a solution process, inks having colors corresponding to the respective sub-pixels SP1, SP2 and SP3 are injected or dropped and then hardened. As a result, the organic emission layers 132A, 132B and 132C may be formed. If the organic emission layers 132A, 132B and 132C are formed through a solution process, it is possible to reduce manufacturing costs, compared to a case where organic emission layers are formed through a deposition process. Also, it is easy to manufacture a large-area display device. Meanwhile, when the organic emission layers 132A, 132B and 132C are formed through a solution process, ink having colors corresponding to the respective sub-pixels are injected or dropped and then hardened to form the organic emission layers. In this case, if an emission area of a sub-pixel has a narrow width, an ink corresponding thereto may flow to another adjacent sub-pixel, and, thus, color mixing may easily occur. Particularly, if the widths of a sub-pixel and a bank are reduced to implement high resolution, color mixing occurs more frequently, which causes defects.

As described above, a red sub-pixel having high emission efficiency has a smaller emission area than a blue sub-pixel. Unlike in the organic light emitting display device according to an exemplary embodiment of the present disclosure, the major axis lengths of the emission areas in the first to third sub-pixels may be set to be identical to each other and the sizes of the emission areas may be regulated by regulating the minor axis lengths thereof. In this case, the emission area of the red sub-pixel has the shortest minor axis length. Therefore, when an organic emission layer is formed through a solution process, it is difficult to drop an ink onto the red sub-pixel and defects such as color mixing may occur. Also, if a specific emission area has a short minor axis length, an ink may not spread uniformly within the emission area. This may cause thickness deviation of an organic emission layer and thus result in degradation in emission efficiency.

However, in the organic light emitting display device 100 according to an exemplary embodiment of the present disclosure, the minor axis lengths x1, x2 and x3 of the emission areas EA1, EA2 and EA3 are set to be identical to each other and the major axis lengths y1, y2 and y3 thereof are set to be different from each other. Therefore, it is possible to provide a sufficient space to drop an ink onto a red sub-pixel and also possible to reduce or minimize color mixing of inks.

As illustrated in FIG. 2, due to differences among the major axis lengths y1, y2 and y3 of the emission areas EA1, EA2 and EA3, the emission area EA2 of the second sub-pixel SP2 which is a red sub-pixel may be designed to have the smallest size and the emission area EA1 of the first sub-pixel SP1 which is a blue sub-pixel may be designed to have the largest size. Thus, a non-emission area NEA2 of the second sub-pixel SP2 has the largest size and a non-emission area NEA1 of the first sub-pixel SP1 has the smallest size. Since the minor axis lengths x1, x2 and x3 of the emission areas EA1, EA2 and EA3 are fixed to be identical to each other and the major axis lengths y1, y2 and y3 thereof are different from each other, a large available space may be formed in a lower part of the second sub-pixel SP2. Thus, in the organic light emitting display device 100 according to an exemplary embodiment of the present disclosure, a contact area between anodes 131A, 131B and 131C and driving thin film transistors DT1, DT2 and DT3 of the first sub-pixel SP1, the second sub-pixel SP2 and the third sub-pixel SP3 may be disposed in the non-emission area NEA2 of the second sub-pixel SP2. Otherwise, a contact area between a cathode 133 and a low-potential voltage line VSSL may be disposed in the non-emission area NEA2 of the second sub-pixel SP2. Details thereof will be described with reference to FIG. 3 through FIG. 5.

Hereinafter, the components of the organic light emitting display device 100 will be described in detail with reference to FIG. 3 through FIG. 5. FIG. 3 is a plan view of the first pixel PX1 illustrated in FIG. 1 and FIG. 2 according to an embodiment of the present disclosure. FIG. 4 is a cross-sectional view of the first pixel PX1 illustrated in FIG. 3 as taken along the first direction (X-axis direction) according to an embodiment of the present disclosure. FIG. 4 shows respective cross-sections of the emission areas EA1, EA2 and EA3 of the first sub-pixel SP1, the second sub-pixel SP2 and the third sub-pixel SP3. FIG. 5 is a cross-sectional view of the first pixel PX1 illustrated in FIG. 3 as taken along the first direction (X-axis direction) according to an embodiment of the present disclosure. FIG. 5 shows respective cross-sections of the emission area EA1 of the first sub-pixel SP1, the non-emission area NEA2 of the second sub-pixel SP2 and the emission area EA3 of the third sub-pixel SP3.

FIG. 3 through FIG. 5 illustrate that the organic light emitting display device 100 is of top emission type as an example. However, the present disclosure is not limited thereto. Referring to FIG. 3 through FIG. 5, the organic light emitting display device 100 includes a substrate 110, a thin film transistor, an organic light emitting element 130, a bank layer 140 and an encapsulation unit 150.

Referring to FIG. 4 and FIG. 5, the substrate 110 serves to support and protect various components of the organic light emitting display device 100. The substrate 110 may be formed of glass or a plastic material having flexibility. If the substrate 110 is formed of a plastic material, it may be formed of, e.g., polyimide (PI), but is not limited thereto.

Referring to FIG. 3, data lines DL and scan lines SL crossing each other are disposed on the substrate. Although FIG. 3 illustrates straight data lines DL and scan lines SL, the data lines DL and scan lines SL may have a diagonal line shape, a curved line shape or a zigzag shape, but are not limited thereto. Referring to FIG. 4 and FIG. 5, the data lines DL may be disposed on the substrate and under a buffer layer 111, but are not limited thereto. The scan lines SL may be disposed under the data lines DL, but are not limited thereto.

A high-potential voltage line VDDL and a low-potential voltage line VSSL crossing each other may be disposed on the substrate 110, but are not limited thereto. The high-potential voltage line VDDL supplies a high-potential voltage to the driving thin film transistors DT1, DT2 and DT3 of the respective sub-pixels SP1, SP2 and SP3. The low-potential voltage line VSSL supplies a low-potential voltage to the cathode 133 of organic light emitting elements 130A, 130B and 130C.

The buffer layer 111 is disposed on the substrate 110. The buffer layer 111 may improve adhesiveness between layers formed on the buffer layer 111 and the substrate 110. Also, the buffer layer 111 may block alkali components leaked from the substrate 110 and suppress the diffusion of moisture and/or oxygen permeating from the outside of the substrate 110. The buffer layer 111 may be formed as a single layer or a multilayer of silicon nitride (SiNx) or silicon oxide (SiOx) but is not limited thereto. However, the buffer layer 111 may also be omitted based on the type and material of the substrate 110 and the structure and type of the thin film transistor.

The thin film transistor is disposed on the buffer layer 111. Referring to FIG. 3, each pixel PX includes the first sub-pixel SP1, the second sub-pixel SP2 and the third sub-pixel SP3. In this case, each of the first sub-pixel SP1, the second sub-pixel SP2 and the third sub-pixel SP3 has a 2T1C structure including two thin film transistors and one capacitor. Specifically, the respective sub-pixels SP1, SP2 and SP3 may include the driving thin film transistors DT1, DT2 and DT3 and switching thin film transistors ST1, ST2 and ST3. However, the structure of each sub-pixel is not limited to the 2T1C structure. Each sub-pixel may be configured to have various additional compensation structures such as a 3T1C structure including three thin film transistors and one capacitor or a 4T2C structure including four thin film transistors and two capacitors. Meanwhile, the illustration of an organic emission layer and a cathode of an organic light emitting element is omitted from FIG. 3, and the thicknesses and shapes of the respective lines are schematically illustrated.

For convenience of explanation, the driving thin film transistor DT1 and the switching thin film transistor ST1 disposed in the first sub-pixel SP1 will be described.

A gate electrode G1 of the switching thin film transistor ST1 is connected to a scan line SL and a source electrode S1 of the switching thin film transistor ST1 is connected to a data line DL. Also, a drain electrode D1 of the switching thin film transistor ST1 is connected to a connection electrode CE1 of a capacitor formed of the same metal as the scan line SL and a gate electrode G2 of the driving thin film transistor DT1. When the switching thin film transistor ST1 is turned on in response to a scan signal Scan applied through the scan line SL, it applies a data voltage Vdata supplied through the data line DL to the gate electrode G2 of the driving thin film transistor DT1.

The gate electrode G2 of the driving thin film transistor DT1 is connected to the connection electrode CE1 of the capacitor and connected to the drain electrode D1 of the switching thin film transistor ST1. Also, a source electrode S2 of the driving thin film transistor DT1 is connected to the high-potential voltage line VDDL and a drain electrode D2 of the driving thin film transistor DT1 is connected to the anode 131A of the organic light emitting element 130A. When the switching thin film transistor ST1 is turned on and applies the data voltage Vdata to the gate electrode G2 of the driving thin film transistor DT1, the driving thin film transistor DT1 is turned on and supplies a current to the organic light emitting element 130A. The capacitor is connected between the source electrode S2 of the driving thin film transistor DT1 and the gate electrode G2 of the driving thin film transistor DT1. Also, the capacitor stores a difference in voltage between a high-potential voltage applied to the source electrode S2 of the driving thin film transistor DT1 and the data voltage Vdata applied to the gate electrode G2 of the driving thin film transistor DT1. Thus, the capacitor may supply a constant current to the organic light emitting element 130A. The cathode 133 of the organic light emitting element 130A is connected to the low-potential voltage line VSSL and supplied with a low-potential voltage.

In the organic light emitting display device 100 according to an exemplary embodiment of the present disclosure, the thin film transistors DT1 and ST1 are configured as a bottom-gate thin film transistor, but are not limited thereto. In the bottom-gate thin film transistor DT1 or ST1, an active layer A1 or A2 is disposed on the gate electrode G1 or G2 and the source electrode S1 or S2 and the drain electrode D1 or D2 are disposed on the active layer A1 or A2, respectively. That is, the gate electrode G1 or G2 is disposed as the lowermost layer.

Specifically, referring to FIG. 5, the gate electrode G2 of the driving thin film transistor DT1 is disposed on the substrate 110. The gate electrode G2 may be formed of one of various metal materials such as molybdenum (Mo), aluminum (Al), chromium (Cr), gold (Au), titanium (Ti), nickel (Ni), neodymium (Nd) and copper (Cu), an alloy of two or more thereof, or a multilayer thereof, but is not limited thereto.

A gate insulating layer 112 is disposed on the gate electrode G2. The gate insulating layer 112 serves to electrically insulate the gate electrode G2 and the active layer A2 and may be formed of an insulating material. For example, the gate insulating layer 112 may be formed as a single layer or a multilayer of inorganic materials such as silicon nitride (SiNx) or silicon oxide (SiOx) but is not limited thereto.

The active layer A2 is disposed on the gate insulating layer 112. The active layer A2 is disposed to overlap the gate electrode G2. For example, the active layer A2 may be formed of an oxide semiconductor, amorphous silicon (a-Si), polycrystalline silicon (poly-Si), or an organic semiconductor.

An etch stopper 113 is disposed on the active layer A2. The etch stopper 113 may be formed to suppress damage to the surface of the active layer A2 by plasma when the source electrode S2 and the drain electrode D2 are patterned and formed by etching. One end of the etch stopper 113 may overlap the source electrode S2 and the other end may overlap the drain electrode D2. The etch stopper 113 may also be omitted.

The source electrode S2 and the drain electrode D2 are disposed on the active layer A2 and the etch stopper 113. The source electrode S2 and the drain electrode D2 are separated from each other on the same layer. The source electrode S2 and the drain electrode D2 may be electrically connected to the active layer A2 to be in contact with the active layer A2. Each of the source electrode S2 and the drain electrode D2 may be formed of one of various metal materials such as molybdenum (Mo), aluminum (Al), chromium (Cr), gold (Au), titanium (Ti), nickel (Ni), neodymium (Nd) and copper (Cu), an alloy of two or more thereof, or a multilayer thereof, but is not limited thereto.

Referring to FIG. 5, a passivation layer 114 for protecting the driving thin film transistor DT1 is disposed on the driving thin film transistor DT1. A contact hole for exposing the drain electrode D2 of the driving thin film transistor DT1 is formed in the passivation layer 114. Although FIG. 5 illustrates that the contact hole for exposing the drain electrode D2 is formed in the passivation layer 114, a contact hole for exposing the source electrode S2 may be formed therein. The passivation layer 114 may be formed as a single layer or a multilayer of silicon nitride (SiNx) or silicon oxide (SiOx). However, the passivation layer 114 may also be omitted in some exemplary embodiments.

An overcoating layer 115 for planarizing an upper part of the driving thin film transistor DT1 is disposed on the passivation layer 114. The contact hole for exposing the drain electrode D2 of the driving thin film transistor DT1 is formed in the overcoating layer 115. Although FIG. 5 illustrates that the contact hole for exposing the drain electrode D2 is formed in the overcoating layer 115, a contact hole for exposing the source electrode S2 may be formed therein. The overcoating layer 115 may be formed of one of acrylic resin, epoxy resin, phenol resin, polyamide resin, polyimide resin, unsaturated polyester resin, polyphenylene resin, polyphenylene sulfide resin, benzocyclobutene and photoresist, but is not limited thereto.

The organic light emitting elements 130A, 130B and 130C are disposed on the overcoating layer 115. The organic light emitting elements 130A, 130B and 130C of the present disclosure are self-emitting elements and may be driven by the driving thin film transistors DT1, DT2 and DT3 disposed in the respective sub-pixels SP1, SP2 and SP3. The respective organic light emitting elements 130A, 130B and 130C include the anodes 131A, 131B and 131C, the organic emission layers 132A, 132B and 132C, and the cathode 133.

The anodes 131A, 131B and 131C are disposed on the overcoating layer 115. The anodes 131A, 131B and 131C may be formed on the overcoating layer 115 to be separated in the first sub-pixel SP1, the second sub-pixel SP2 and the third sub-pixel SP3, respectively. The anodes 131A, 131B and 131C are electrically connected to the drain electrodes D2 of the driving thin film transistors DT1, DT2 and DT3, respectively, through the contact hole formed in the overcoating layer 115 and the passivation layer 114.

The anodes 131A, 131B and 131C serve to supply holes to the respective organic emission layers 132A, 132B and 132C and are formed of a conductive material having a high work function. For example, the anodes 131A, 131B and 131C may be formed of one or more selected from transparent conductive oxides including indium-tin-oxide (ITO), indium-zinc-oxide (IZO), indium-tin-zinc oxide (ITZO), tin oxide ($SnO_2$), zinc oxide (ZnO), indium-copper-oxide (ICO) and Al:ZnO (AZO), but are not limited thereto. If the organic light emitting display device 100 is driven in a top emission mode, the anodes 131A, 131B and 131C may have a structure in which a layer formed of a transparent conductive oxide and a reflective layer formed of a metal material are laminated. The reflective layer may be formed of metal having a high reflectivity to reflect light, which is emitted from the organic emission layers 132A, 132B and 132C, upwards.

Referring to FIG. 3, the anodes 131A, 131B and 131C of the first sub-pixel SP1, the second sub-pixel SP2 and the third sub-pixel SP3 have different sizes, respectively. The emission areas EA1, EA2 and EA3 of the sub-pixels SP1, SP2 and SP3 may be defined by the sizes of the anodes 131A, 131B and 131C, respectively. As described above with reference to FIG. 2, the emission area EA2 of the second sub-pixel SP2 which is a red sub-pixel has the smallest size and the emission area EA1 of the first sub-pixel SP1 which is a blue sub-pixel has the largest size. Therefore, the anode 131A of the first sub-pixel SP1 may be the largest in size, the anode 131C of the third sub-pixel SP3 may be the second largest in size, and the anode 131B of the second sub-pixel SP2 may be the smallest in size.

Meanwhile, a part of the anode 131A of the first sub-pixel SP1 and a part of the anode 131C of the third sub-pixel SP3 protrude toward the non-emission area NEA2 of the second sub-pixel SP2. Referring to FIG. 3, the anode 131A of the first sub-pixel SP1 has a protrusion extended long from its lower part to the second sub-pixel SP2 adjacent thereto on the right side. Also, the anode 131C of the third sub-pixel SP3 has a protrusion extended long from its lower part to the second sub-pixel SP2 adjacent thereto on the left side. The protrusion of the anode 131A of the first sub-pixel SP1 and the protrusion of the anode 131C of the third sub-pixel SP3 are respectively connected to drain electrodes of driving thin film transistors in the non-emission area NEA2 of the second sub-pixel SP2.

Specifically, referring to FIG. 3 and FIG. 5, the drain electrode D2 of the driving thin film transistor DT1 in the first sub-pixel SP1 is connected to a first auxiliary electrode AE1 disposed in the non-emission area NEA2 of the second sub-pixel SP2. Also, a drain electrode of the driving thin film transistor DT3 in the third sub-pixel SP3 is connected to a second auxiliary electrode AE2 disposed in the non-emission area NEA2 of the second sub-pixel SP2. The anode 131A of the first sub-pixel SP1 is connected to the first auxiliary electrode AE1 disposed in the non-emission area NEA2 of the second sub-pixel SP2 through a first contact hole CT1. Also, the anode 131C of the third sub-pixel SP3 is connected to the second auxiliary electrode AE2 disposed in the non-emission area NEA2 of the second sub-pixel SP2 through a third contact hole CT3. Meanwhile, unlike in the first sub-pixel SP1 and the third sub-pixel SP3, the anode 131B in the second sub-pixel SP2 does not have a protrusion. Also, the anode 131B is connected to the drain electrode D2 of the driving thin film transistor DT2 of the second sub-pixel SP2 in the non-emission area NEA2 of the second sub-pixel SP2 through a second contact hole CT2. Therefore, all the first contact hole CT1, the second contact hole CT2 and the third contact hole CT3 are disposed in the non-emission area NEA2 of the second sub-pixel SP2.

As can be seen from FIG. 3, the anode 131A of the second sub-pixel SP2 which is a red sub-pixel has the smallest size. Therefore, an area where the anode 131A of the second sub-pixel SP2 is not disposed, i.e., the non-emission area NEA2, is the largest in size. Thus, an available space of the second sub-pixel SP2 where the anode 131A is not disposed may be used to gather therein the contact holes CT1, CT2 and CT3 for connecting the anodes 131A, 131B and 131C and the driving thin film transistors DT1, DT2 and DT3 of the respective sub-pixels SP1, SP2 and SP3. Therefore, it is possible to reduce or minimize the non-emission area.

The bank layer 140 is disposed on the anodes 131A, 131B and 131C and the overcoating layer 115. The bank layer 140 is formed at the boundary between a plurality of sub-pixels SP1, SP2 and SP3 to distinguish adjacent sub-pixels. Also, the bank layer 140 may partition the emission areas EA1, EA2 and EA3 from the non-emission areas NEA1, NEA2 and NEA3 in the respective sub-pixels SP1, SP2 and SP3. Since the bank layer 140 is not disposed in the emission areas EA1, EA2 and EA3, the organic emission layers 132A, 132B and 132C are located right on the anodes 131A, 131B and 131C. Thus, light may be generated from the organic emission layers 132A, 132B and 132C. That is, areas where the bank layer 140 is disposed may be defined as the non-emission areas NEA1, NEA2 and NEA3, and areas where the bank layer 140 is not disposed may be defined as the emission areas EA1, EA2 and EA3.

The bank layer 140 includes a hydrophilic bank layer 141 and a hydrophobic bank layer 142.

The hydrophilic bank layer 141 may be formed of a hydrophilic material. The hydrophilic bank layer 141 is disposed to cover edges of the anodes 131A, 131B and 131C and defines the emission areas EA1, EA2 and EA3. The hydrophilic bank layer 141 may be formed in the entire area except the emission areas EA1, EA2 and EA3. That is, the hydrophilic bank layer 141 is disposed on the overcoating layer 115 in the non-emission areas NEA1, NEA2 and NEA3.

The hydrophobic bank layer 142 may be formed of a hydrophobic material. For example, the hydrophobic bank layer 142 may be formed of a hydrophobic organic insulating material or may be a structure obtained by performing hydrophobic treatment to a surface of an insulating material.

The hydrophobic bank layer 142 is disposed on the hydrophilic bank layer 141 so as to overlap a part of the hydrophilic bank layer 141. Here, the hydrophobic bank layer 142 partitions the first sub-pixel SP1, the second sub-pixel SP2 and the third sub-pixel SP3 extended long in the second direction (vertical direction) and aligned in the first direction (horizontal direction) in the non-emission areas NEA1, NEA2 and NEA3.

The organic light emitting display device 100 according to an exemplary embodiment of the present disclosure includes two types of bank layers composed of the hydrophilic bank layer 141 and the hydrophobic bank layer 142 located on the hydrophilic bank layer 141. Therefore, the hydrophilic bank layer 141 and the hydrophobic bank layer 142 are used to reduce thickness deviation among the organic emission layers 132A, 132B and 132C. Specifically, the hydrophilic bank layer 141 having relatively high energy is located under the hydrophobic bank layer 142 and thus has excellent wettability with respect to an ink for forming the organic emission layers 132A, 132B and 132C. Therefore, during a solution process for forming the organic emission layers 132A, 132B and 132C, it is possible to suppress a pile-up phenomenon which may occur at side surfaces of the bank layer.

Although FIG. 2 through FIG. 5 illustrate that the hydrophilic bank layer 141 is formed into a matrix shape to surround an anode, the hydrophilic bank layer 141 may have another shape extended in the first direction (horizontal direction) rather than a matrix shape. In this case, the hydrophilic bank layer is a horizontal bank to partition the emission areas along the second direction (vertical direction) and the hydrophobic bank layer partitions emission areas along the first direction (horizontal direction).

Referring to FIG. 6, in the organic light emitting display device 100 according to an exemplary embodiment of the present disclosure, an outer bank layer 144 is disposed along the non-display area NDA to surround the plurality of sub-pixels SP in the display area DA. During a solution process, the outer bank layer 144 suppresses an overflow of an ink from the display area to the non-display area where a driving circuit unit and a pad unit are disposed. The outer bank layer 144 may be formed of a hydrophobic material.

Meanwhile, an auxiliary bank layer 145 may be formed on a side surface of the outer bank layer 144. Specifically, the auxiliary bank layer 145 may be formed on the outer bank layer 144 along an inner side surface of the outer bank layer 144 but is not limited thereto. That is, the auxiliary bank layer 145 may be further formed on an upper surface or an outer side surface of the outer bank layer 144.

The auxiliary bank layer 145 is formed of a hydrophobic material. The auxiliary bank layer 145 enables an ink coated in the second direction (vertical direction) to spread uniformly. Thus, entire organic emission layers in sub-pixels emitting the same color and aligned in the second direction (vertical direction) may be formed to have a uniform thickness.

The organic emission layers 132A, 132B and 132C are disposed to be in contact with the anodes 131A, 131B and 131C and the bank layer 140 in the sub-pixels SP1, SP2 and SP3, respectively. For example, the organic emission layers 132A, 132B and 132C may be disposed on the anodes 131A, 131B and 131C and surrounded by the bank layer 140 in the emission areas EA1, EA2 and EA3, respectively.

The organic emission layers 132A, 132B and 132C serve to emit light of a specific color and may be separated from each other for the respective sub-pixels SP1, SP2 and SP3. For example, the organic emission layer 132A disposed in the first sub-pixel SP1 which is a blue sub-pixel is a blue emission layer. Also, the organic emission layer 132B disposed in the second sub-pixel SP2 which is a red sub-pixel is a red emission layer. Further, the organic emission layer 132C disposed in the third sub-pixel SP3 which is a green sub-pixel is a green emission layer. The organic emission layer 132A disposed in the first sub-pixel SP1, the organic emission layer 132B disposed in the second sub-pixel SP2 and the organic emission layer 132C disposed in the third sub-pixel SP3 may be disposed to be separated from each other.

Each of the organic emission layers 132A, 132B and 132C may be formed through a solution process such as inkjet printing or nozzle printing. However, the solution process is not limited thereto. The organic emission layers 132A, 132B and 132C may be formed by using various known solution processes. When the organic emission layers 132A, 132B and 132C are formed in the respective sub-pixels SP1, SP2 and SP3 through a solution process, inks having colors corresponding to the respective sub-pixels SP1, SP2 and SP3 are injected or dropped and then hardened to form the organic emission layers 132A, 132B and 132C. If the organic emission layers 132A, 132B and 132C are formed through a solution process, it is possible to reduce manufacturing costs, compared to a case where organic emission layers are formed through a deposition process. It is possible to provide a large-area display device.

The cathode 133 is disposed on the organic emission layers 132A, 132B and 132C. Referring to FIG. 4 and FIG. 5, the cathode 133 is disposed as a single continuous layer on the organic emission layers 132A, 132B and 132C and the bank layer 140 in the emission areas EA1, EA2 and EA3. For example, the cathode 133 may be disposed to be in contact with the organic emission layers 132A, 132B and 132C and disposed along the shape of the organic emission layers 132A, 132B and 132C. The cathode 133 may not be separated for each of the first sub-pixel SP1, the second sub-pixel SP2 and the third sub-pixel SP3, but may be formed as a continuous layer.

Meanwhile, the cathode 133 may not be formed as a single continuous layer, but may be patterned like the anodes 131A, 131B and 131C. For example, the cathode 133 may be disposed to correspond only to the emission areas EA1, EA2 and EA3 and may not be disposed in the non-emission areas NEA1, NEA2 and NEA3.

If the organic light emitting display device 100 is driven in a top emission mode, the cathode 133 may be a transflective electrode formed of a metal material such as silver (Ag), copper (Cu), magnesium-silver alloy (Mg:Ag) to a very small thickness. Otherwise, the cathode 133 may be a transparent electrode containing transparent conductive oxide or ytterbium (Yb) alloy, but is not limited thereto.

Referring to FIG. 3, the low-potential voltage line VSSL is extended in the first direction (horizontal direction) so as to traverse the first sub-pixel SP1, the second sub-pixel SP2 and the third sub-pixel SP3. Here, the low-potential voltage line VSSL is connected to the cathode 133 in the non-emission area NEA2 of the second sub-pixel SP2. Specifically, the low-potential voltage line VSSL extended in the first direction (horizontal direction) protrudes in the second sub-pixel SP2 toward the non-emission area NEA2. The low-potential voltage line VSSL may be electrically connected to the cathode 133 through a contact area C/A.

As described above about the first contact hole CT1, the second contact hole CT2 and the third contact hole CT3, the emission area EA2 of the second sub-pixel SP2 which is a red sub-pixel has the smallest size. Thus, the non-emission area NEA2 of the second sub-pixel SP2 has the largest size. Therefore, the contact area C/A where the low-potential voltage line VSSL is connected to the cathode 133 may be disposed in the non-emission area NEA2, which is an available space, of the second sub-pixel SP2.

In the top emission organic light emitting display device, the cathode 133 is formed to a small thickness for light transmission. Thus, due to a high sheet resistance of the cathode 133, a contact area between the cathode 133 and the low-potential voltage line VSSL may be degraded, and other organic materials adjacent thereto may be damaged. Such degradation may be solved by increasing the contact area between the cathode 133 and the low-potential voltage line VSSL. In a conventional organic light emitting display device, an additional space is needed to increase the contact area between the cathode 133 and the low-potential voltage line VSSL, which causes an increase in the size of a non-emission area. However, in the organic light emitting display device according to an exemplary embodiment of the present disclosure, the cathode 133 is connected to the low-potential voltage line VSSL in the large non-emission area of the second sub-pixel SP2 which is a red sub-pixel. Therefore, the contact area may have a large size.

The encapsulation unit 150 is disposed on the cathode 133. The encapsulation unit 150 is disposed on the bank layer 140 and the organic light emitting elements 130A, 130B and 130C. The encapsulation unit 150 may suppress the permeation of oxygen and moisture into the organic light emitting display device 100 from the outside. For example, when the organic light emitting display device 100 is exposed to moisture or oxygen, a pixel shrinkage phenomenon in which the emission areas EA1, EA2 and EA3 are reduced may occur or a dark spot in the emission areas EA1, EA2 and EA3 may occur. Thus, the encapsulation unit 150 may block oxygen and moisture to protect the organic light emitting display device 100.

The encapsulation unit 150 includes a first encapsulation layer 151, a second encapsulation layer 152 and a third encapsulation layer 153. The first encapsulation layer 151 may be disposed on the cathode 133 along the shape of the cathode 133 and may suppress the permeation of moisture or oxygen. The first encapsulation layer 151 may be formed of an inorganic material such as silicon nitride (SiNx), silicon oxynitride (SiOxNy) or aluminum oxide (AlyOz), but is not limited thereto.

The second encapsulation layer 152 is disposed on the first encapsulation layer 151 and may planarize the surface. Further, the second encapsulation layer 152 may cover foreign materials or particles which may be generated during a manufacturing process of the organic light emitting display device 100. The second encapsulation layer 152 may be formed of an organic material such as silicon oxycarbide (SiOxCz), acryl or epoxy-based resin, but is not limited thereto.

The third encapsulation layer 153 is disposed on the second encapsulation layer 152 and may suppress the permeation of moisture or oxygen like the first encapsulation layer 151 does. The third encapsulation layer 153 may be formed of an inorganic material such as silicon nitride (SiNx), silicon oxynitride (SiOxNy), silicon oxide (SiOx) or aluminum oxide (AlyOz), but is not limited thereto.

The organic light emitting display device according to an exemplary embodiment of the present disclosure is manufactured through a solution process without using an FMM. Herein, two types of bank layers formed of a hydrophobic material and a hydrophilic material may be used to partition an emission area from a non-emission area. In the organic light emitting display device according to an exemplary embodiment of the present disclosure, emission areas of a blue sub-pixel, a red sub-pixel and a green sub-pixel are identical to each other in minor axis length. Also, a major axis length increases in the order of the blue sub-pixel, the green sub-pixel and the red sub-pixel. When organic emission layers are formed in the respective sub-pixels through a solution process, the emission areas have the sizes as described above. Therefore, it is possible to suppress color mixing of inks and defects which may occur during a process.

Also, in organic light emitting display device according to an exemplary embodiment of the present disclosure, respective contact holes for connecting anodes and thin film transistors of other sub-pixels are formed in a non-emission area of the red sub-pixel by regulating the size of the emission area. Thus, an available space may be used. Further, a contact area between a cathode and a low-potential voltage line is formed in the non-emission area of the red sub-pixel. Thus, the contact area between the cathode and the low-potential voltage line may be increased or maximized.

Figure 7:
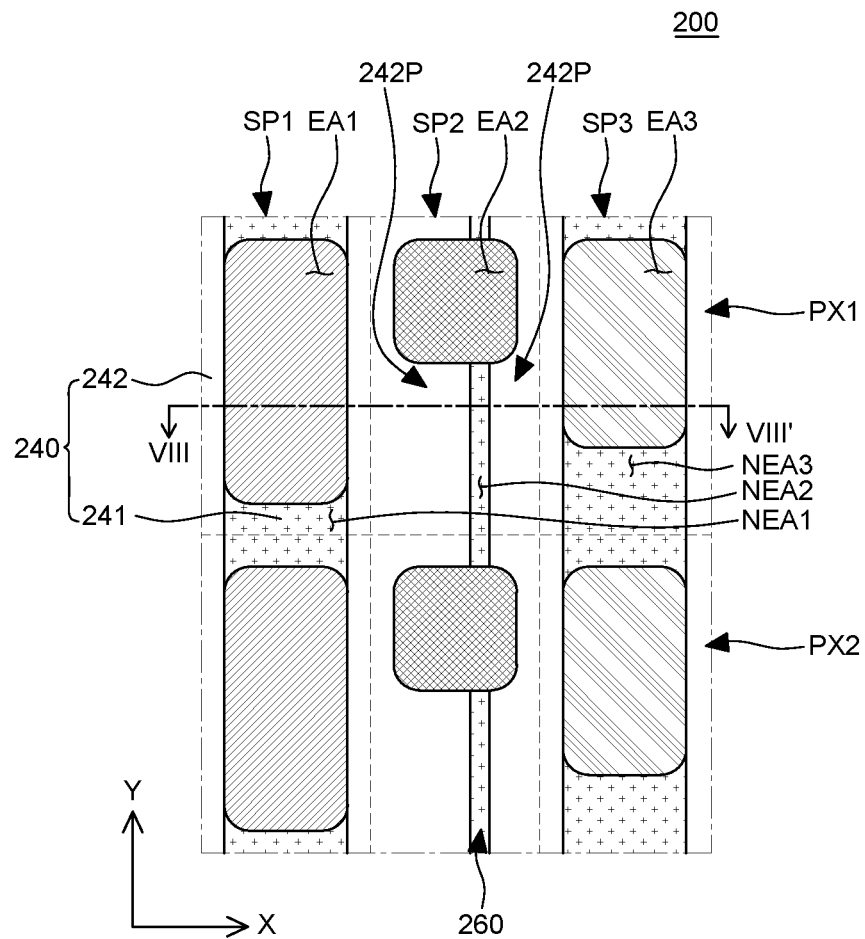
FIG. 7 is a schematic enlarged plan view of an organic light emitting display device according to another exemplary embodiment of the present disclosure.
Figure 8:
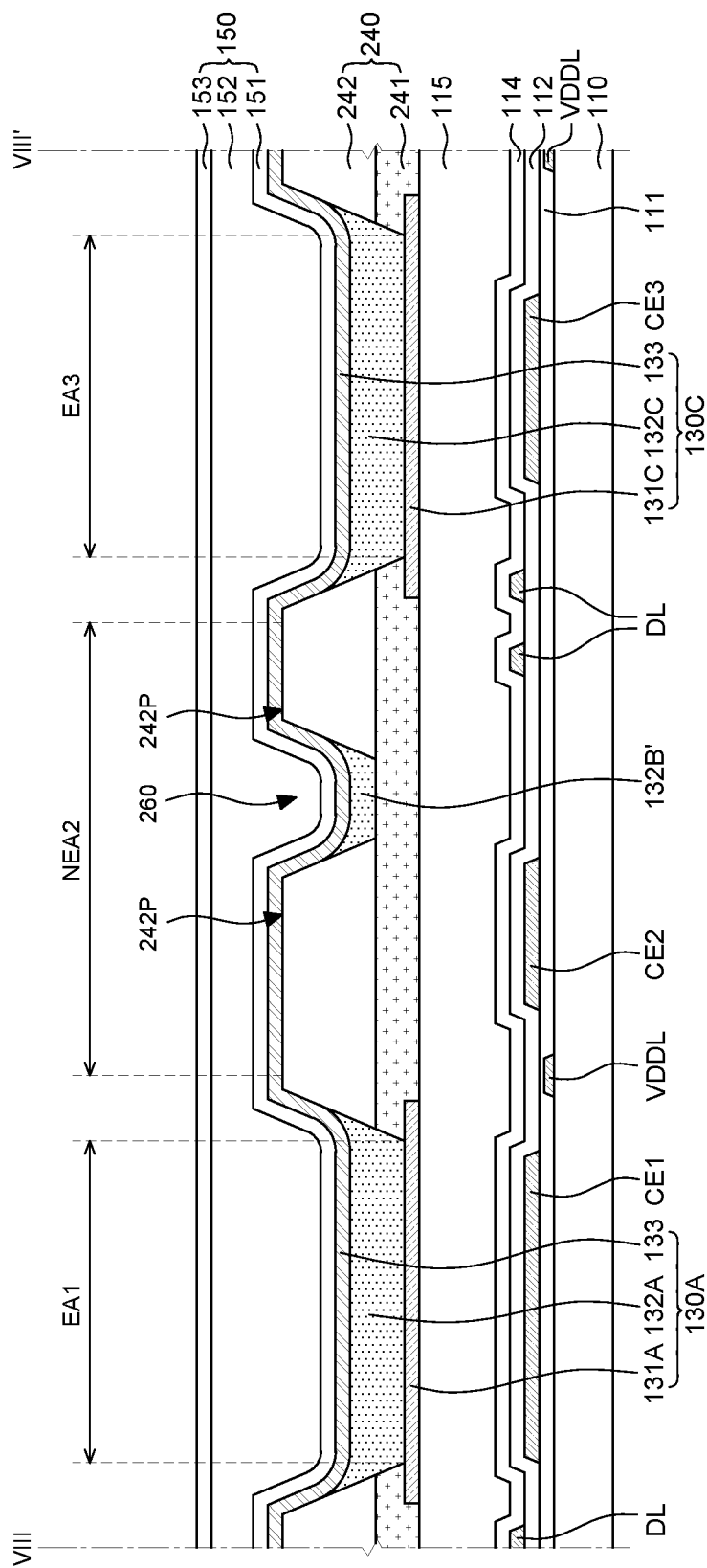
FIG. 8 is a cross-sectional view of the organic light emitting display device as taken along a line VIII-VIII' of FIG. 7 according to an embodiment of the present disclosure.

FIG. 7 and FIG. 8 are views provided to explain an organic light emitting display device according to another exemplary embodiment of the present disclosure.

FIG. 7 is a schematic enlarged plan view of the organic light emitting display device according to another exemplary embodiment of the present disclosure. FIG. 8 is a cross-sectional view of the organic light emitting display device as taken along a line VIII-VIII' of FIG. 7 according to an embodiment of the present disclosure. FIG. 8 is a cross-sectional view of a pixel illustrated in FIG. 7 as taken along the first direction. Particularly, FIG. 8 illustrates respective cross-sections of the emission area EA1 of the first sub-pixel SP1, the non-emission area NEA2 of the second sub-pixel SP2 and the emission area EA3 of the third sub-pixel SP3. An organic light emitting display device 200 illustrated in FIG. 7 and FIG. 8 is substantially the same as the organic light emitting display device 100 illustrated in FIG. 1 through FIG. 6 except a bank layer 240. Therefore, redundant description thereof will be omitted.

Referring to FIG. 7, the bank layer 240 includes a hydrophilic bank layer 241 and a hydrophobic bank layer 242. As in the organic light emitting display device 100 illustrated in FIG. 1 through FIG. 6, the hydrophilic bank layer 241 is disposed to cover edges of the anodes 131A, 131B and 131C and defines the emission areas EA1, EA2 and EA3. Also, the hydrophobic bank layer 242 partitions the first sub-pixel SP1, the second sub-pixel SP2 and the third sub-pixel SP3 extended long in the second direction (vertical direction) and aligned in the first direction in the non-emission areas NEA1, NEA2 and NEA3.

Here, the hydrophobic bank layer 242 includes a protrusion 242P which overlaps a part of the hydrophilic bank layer 241 located in the non-emission area NEA2 of the second sub-pixel SP2. The protrusion 242P is a bank layer protruding toward the second sub-pixel SP2 from the hydrophobic bank layer 242 extended long in the second direction (vertical direction) between the first sub-pixel SP1 and the second sub-pixel SP2. Also, the protrusion 242P is a bank layer protruding toward the second sub-pixel SP2 from the hydrophobic bank layer 242 extended long in the second direction (vertical direction) between the second sub-pixel SP2 and the third sub-pixel SP3. In the non-emission area NEA2 of the second sub-pixel SP2, the protrusion 242P of the hydrophobic bank layer 242 is disposed on the hydrophilic bank layer 241 and covers the hydrophilic bank layer 241. That is, in the non-emission area NEA2 of the second sub-pixel SP2, a groove 260 connecting the emission areas EA2 of two second sub-pixels SP2 adjacent to each other in the second direction (vertical direction) is formed by the protrusion 242P of the hydrophobic bank layer 242. Here, a minor axis length of the groove 260 is shorter than the minor axis length x2 of the emission area EA2 of the second sub-pixel SP2.

The groove 260 may serve as a passage connecting the emission areas EA2 of the second sub-pixels SP2. Specifically, when an ink containing an organic luminous material is dropped to the emission area EA2 of the second sub-pixel SP2 to form the organic emission layers 132A, 132B and 132C through a solution process, the ink 132B' reaching a predetermined height in the emission area EA2 flows over the hydrophilic bank layer 241 into the groove 260. That is, the ink 132B' filling in the emission area EA2 of the second sub-pixel SP2 fills in the connection groove 260. The ink 132B' flows into an emission area EA2 of another second sub-pixel SP2 adjacent to the second sub-pixel SP2 in the second direction (vertical direction) through the groove 260 and sequentially fills in the emission area EA2.

In the organic light emitting display device according to another exemplary embodiment of the present disclosure, a protrusion of a hydrophobic bank layer extended in the second direction (vertical direction) is disposed in a red sub-pixel having the largest non-emission area. Thus, the protrusion may reduce the amount of ink to be disposed in the non-emission area.

Figure 9:
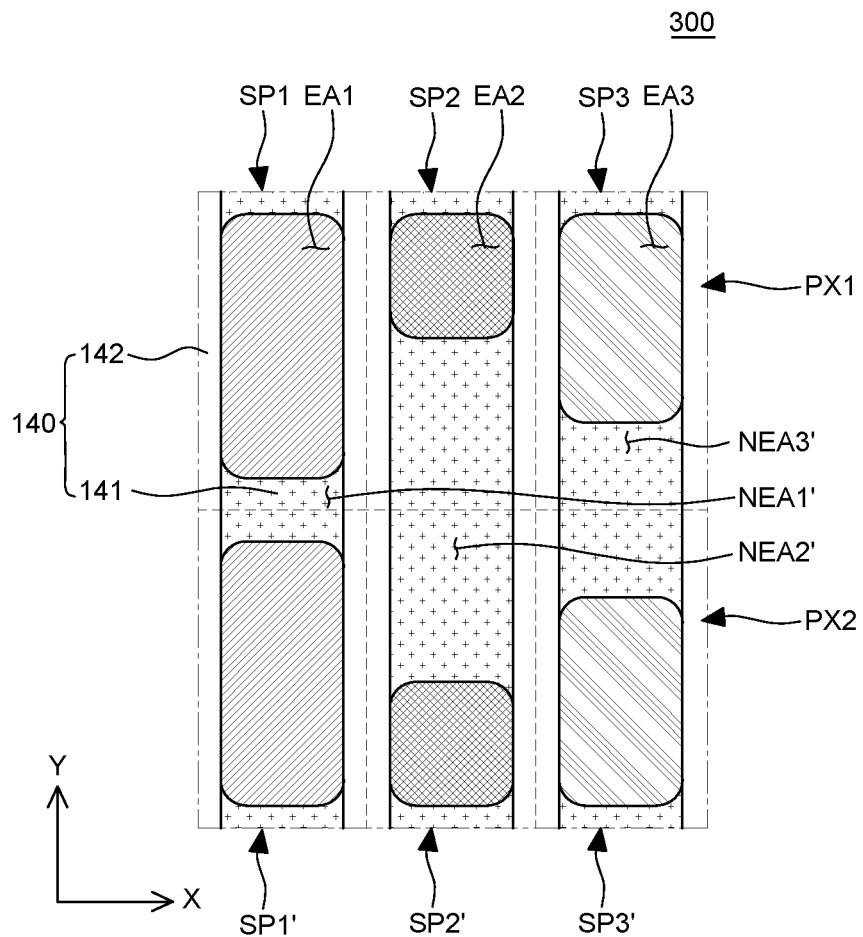
FIG. 9 is a schematic enlarged plan view of an organic light emitting display device according to yet another exemplary embodiment of the present disclosure.
Figure 10:
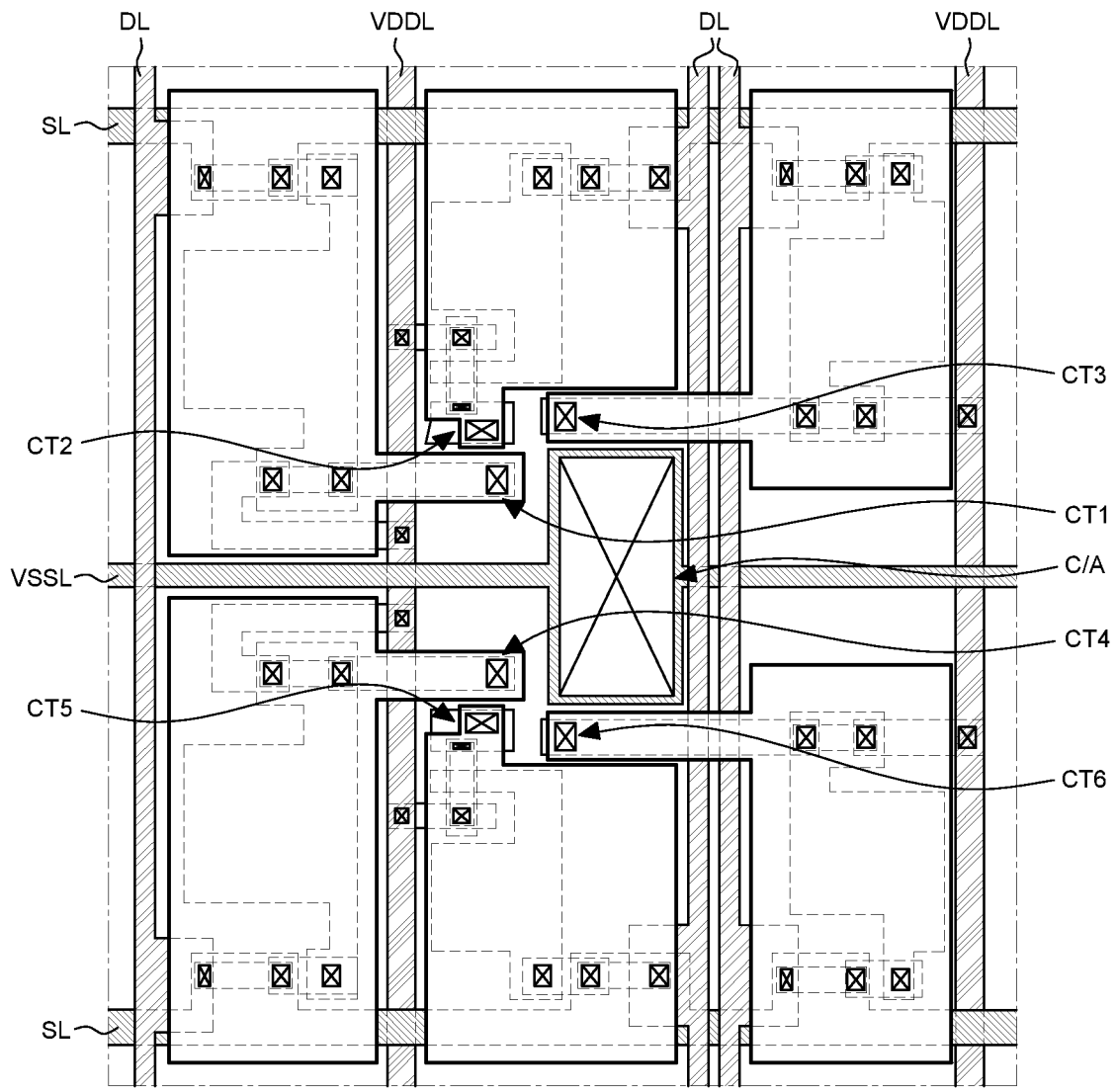
FIG. 10 is an enlarged plan view of a first pixel PX1 and a second pixel PX2 of FIG. 9 according to an embodiment of the present disclosure.

FIG. 9 and FIG. 10 are views provided to explain an organic light emitting display device according to yet another exemplary embodiment of the present disclosure.

FIG. 9 is a schematic enlarged plan view of an organic light emitting display device according to yet another exemplary embodiment of the present disclosure. FIG. 10 is an enlarged plan view of a first pixel PX1 and a second pixel PX2 of FIG. 9 according to an embodiment of the present disclosure. An organic light emitting display device 300 illustrated in FIG. 9 and FIG. is substantially the same as the organic light emitting display device 100 illustrated in FIG. 1 through FIG. 6 except the different arrangement of the emission areas EA1, EA2 and EA3 of the sub-pixels SP1, SP2 and SP3. Therefore, redundant description thereof will be omitted.

Referring to FIG. 9, each of the first pixel PX1 and the second pixel PX2 includes the first sub-pixel SP1, the second sub-pixel SP2 and the third sub-pixel SP3. Also, the first pixel PX1 and the second pixel PX2 are disposed adjacent to each other in the second direction (Y-axis direction). Here, the first pixel PX1 and the second pixel PX2 are symmetrical to each other in shape in the second direction (Y-axis direction).

Specifically, respective upper edges of the emission area EA1 of the first sub-pixel SP1, the emission area EA2 of the second sub-pixel SP2 and the emission area EA3 of the third sub-pixel SP3 in the first pixel PX1 are arranged in line with each other. Also, respective lower edges of the emission area EA1 of the first sub-pixel SP1, the emission area EA2 of the second sub-pixel SP2 and the emission area EA3 of the third sub-pixel SP3 in the second pixel PX2 are arranged in line with each other. Thus, the non-emission areas of the respective sub-pixels SP1, SP2 and SP3 in the first pixel PX1 are formed on the lower side, and the non-emission areas of the respective sub-pixels SP1, SP2 and SP3 in the second pixel PX2 are formed on the upper side. Therefore, the non-emission areas of the first pixel PX1 and the second pixel PX2 are in contact with each other at the boundary between the first pixel PX1 and the second pixel PX2 and integrated into non-emission areas NEA1', NEA2' and NEA3', respectively. Particularly, in the second sub-pixels SP2 of the first pixel PX1 and the second pixel PX2, an integrated non-emission area NEA1', NEA2', NEA3' having a large size may be formed. Therefore, it is easier to place lines and a contact area.

More specifically, referring to FIG. 10, in the first sub-pixel SP1, the second sub-pixel SP2 and the third sub-pixel SP3 of the first pixel PX1, the anodes and the driving thin film transistors are connected through the first contact hole CT1, the second contact hole CT2 and the third contact hole CT3, respectively, formed in the integrated non-emission area NEA2' of the second sub-pixel SP2. Also, in the first sub-pixel SP1, the second sub-pixel SP2 and the third sub-pixel SP3 of the second pixel PX2, the anodes and the driving thin film transistors are connected through a fourth contact hole CT4, a fifth contact hole CT5 and a sixth contact hole CT6, respectively, formed in the integrated non-emission area NEA2' of the second sub-pixel SP2.

Referring to FIG. 10, the low-potential voltage line VSSL is disposed to extend in the first direction (horizontal direction) between the first pixel PX1 and the second pixel PX2. Here, the low-potential voltage line VSSL is connected to the cathode 133 in the integrated non-emission area NEA2' of the second sub-pixel SP2. Specifically, the low-potential voltage line VSSL extended in the first direction (horizontal direction) protrudes toward both sides in the second direction (vertical direction) in the second sub-pixel SP2. The low-potential voltage line VSSL may be electrically connected to the cathode 133 through the contact area C/A. Therefore, a low-potential voltage may be applied simultaneously to the cathode 133 in two pixels adjacent to each other in the second direction through a single low-potential voltage line VSSL. Thus, the number of low-potential voltage lines VSSL may be reduced.

The contact area C/A, where the low-potential voltage line VSSL is in contact with the cathode 133, has a larger size in the organic light emitting display device 300 illustrated in FIG. 10 than in the organic light emitting display device 100 illustrated in FIG. 3. Thus, it is possible to solve degradation which may occur between a cathode and a low-potential voltage line.

The exemplary embodiments of the present disclosure can also be described as follows.

According to an aspect of the present disclosure, there is provided an organic light emitting display device. The organic light emitting display device comprises a plurality of sub-pixels including a first sub-pixel, a second sub-pixel and a third sub-pixel, an anode disposed in each of the plurality of sub-pixels, a bank layer covering an edge of the anode and defining emission areas, an organic emission layer disposed on the anode, and a cathode disposed on the organic emission layer. Each of the first sub-pixel, the second sub-pixel and the third sub-pixel includes a respective one of the emission area and a respective non-emission area, and a minor axis length of the emission area in the first sub-pixel, a minor axis length of the emission area in the second sub-pixel and a minor axis length of the emission area in the third sub-pixel are identical to each other, and a major axis length of the emission area in the first sub-pixel, a major axis length of the emission area in the second sub-pixel and a major axis length of the emission area in the third sub-pixel are different from each other.

The first sub-pixel, the second sub-pixel and the third sub-pixel may be arranged sequentially in a minor axis direction, and the emission area of the second sub-pixel may have a shorter major axis length than the emission area of the first sub-pixel and the emission area of the third sub-pixel.

The non-emission area of the second sub-pixel may have a larger size than the non-emission area of the first sub-pixel and the non-emission area of the third sub-pixel.

The second sub-pixel may be a red sub-pixel. The first sub-pixel may be one of a green sub-pixel and a blue sub-pixel, and the third sub-pixel may be the other one of the green sub-pixel and the blue sub-pixel.

Each of the first sub-pixel, the second sub-pixel and the third sub-pixel may further include a driving thin film transistor electrically connected to the anode, and the anode of the first sub-pixel may be connected to the driving thin film transistor of the first sub-pixel in the non-emission area of the second sub-pixel, and the anode of the third sub-pixel may be connected to the driving thin film transistor of the third sub-pixel in the non-emission area of the second sub-pixel.

The organic light emitting display may further comprise a first auxiliary electrode and a second auxiliary electrode disposed in the non-emission area of the second sub-pixel and respectively connected to a drain electrode of a thin film transistor of the first sub-pixel and a drain electrode of a thin film transistor of the third sub-pixel. The anode of the first sub-pixel may be extended to the non-emission area of the second sub-pixel and electrically connected to the first auxiliary electrode, and the anode of the third sub-pixel may be extended to the non-emission area of the second sub-pixel and electrically connected to the second auxiliary electrode.

A first contact hole for connecting the anode and a thin film transistor of the first sub-pixel, a second contact hole for connecting the anode and a thin film transistor of the second sub-pixel and a third contact hole for connecting the anode and a thin film transistor of the third sub-pixel are disposed to overlap the non-emission area of the second sub-pixel.

The cathode of the first sub-pixel, the second sub-pixel and the third sub-pixel may be provided as a single continuous layer, and the organic light emitting display device may further include a low-potential voltage line for applying a low-potential voltage to the cathode, and the cathode may be electrically connected to the low-potential voltage line in the non-emission area of the second sub-pixel.

A contact area where the cathode is in contact with the low-potential voltage line may be surrounded by the emission area of the first sub-pixel, the emission area of the second sub-pixel and the emission area of the third sub-pixel.

The bank layer may include a hydrophilic bank layer covering edges of the anodes and made of a hydrophilic material and a hydrophobic bank layer extending in a major axis direction and made of a hydrophobic material.

The hydrophobic bank layer may include a protrusion which overlaps a part of the hydrophilic bank layer located in the non-emission area of the second sub-pixel.

The non-emission area of the second sub-pixel may include a groove made by the hydrophobic bank layer and having a shorter minor axis length than the emission area.

The organic light emitting display may further comprise an outer bank layer surrounding the plurality of sub-pixels, and an auxiliary bank layer disposed to be in contact with an inner side surface of the outer bank layer and made of a hydrophilic material.

The organic light emitting display device may further comprise a first pixel and a second pixel each including the first sub-pixel, the second sub-pixel and the third sub-pixel which are arranged sequentially in a minor axis direction. The first pixel and the second pixel may be adjacent to each other in a major axis direction and symmetrical to each other in shape, and the organic light emitting display device may further include a low-potential voltage line arranged between the first pixel and the second pixel, and the low-potential voltage line may be connected to the cathode, which is provided as a single continuous layer in the first pixel and the second pixel, in the non-emission area between the emission area of the second sub-pixel of the first pixel and the emission area of the second sub-pixel of the second pixel.

The low-potential voltage line may include a contact area which protrudes toward both of the first pixel and the second pixel.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a plurality of sub-pixels including a first sub-pixel, a second sub-pixel, and a third sub-pixel;
an anode disposed in each of the plurality of sub-pixels;
a bank layer covering an edge of the anode and defining emission areas;
an organic emission layer on the anode; and
a cathode on the organic emission layer,
wherein each of the first sub-pixel, the second sub-pixel, and the third sub-pixel includes a respective one of the emission areas and a respective non-emission area, and
a minor axis length of the emission area in the first sub-pixel, a minor axis length of the emission area in the second sub-pixel, and a minor axis length of the emission area in the third sub-pixel are identical to each other, and
a major axis length of the emission area in the first sub-pixel, a major axis length of the emission area in the second sub-pixel, and a major axis length of the emission area in the third sub-pixel are different from each other,
wherein each of the first sub-pixel, the second sub-pixel, and the third sub-pixel further includes a driving thin film transistor electrically connected to the anode, and
the anode of the first sub-pixel is connected to the driving thin film transistor of the first sub-pixel in the non-emission area of the second sub-pixel, and the anode of the third sub-pixel is connected to the driving thin film transistor of the third sub-pixel in the non-emission area of the second sub-pixel.

2. The organic light emitting display device according to claim 1, wherein the first sub-pixel, the second sub-pixel, and the third sub-pixel are arranged sequentially in a minor axis direction, and
the emission area of the second sub-pixel has a shorter major axis length than the emission area of the first sub-pixel and the emission area of the third sub-pixel.

3. The organic light emitting display device according to claim 1, wherein the non-emission area of the second sub-pixel has a larger size than the non-emission area of the first sub-pixel and the non-emission area of the third sub-pixel.

4. The organic light emitting display device according to claim 1, wherein the second sub-pixel is a red sub-pixel, the first sub-pixel is one of a green sub-pixel and a blue sub-pixel, and the third sub-pixel is the other one of the green sub-pixel and the blue sub-pixel.

5. The organic light emitting display device according to claim 1, further comprising:
a first auxiliary electrode placed in the non-emission area of the second sub-pixel and connected to a drain electrode of a thin film transistor of the first sub-pixel; and a second auxiliary electrode placed in the non-emission area of the second sub-pixel and connected to a drain electrode of a thin film transistor of the third sub-pixel, wherein the anode of the first sub-pixel is extended to the non-emission area of the second sub-pixel and electrically connected to the first auxiliary electrode, and the anode of the third sub-pixel is extended to the non-emission area of the second sub-pixel and electrically connected to the second auxiliary electrode.

6. The organic light emitting display device according to claim 1, wherein a first contact hole for connecting the anode and a thin film transistor of the first sub-pixel, a second contact hole for connecting the anode and a thin film transistor of the second sub-pixel and a third contact hole for connecting the anode and a thin film transistor of the third sub-pixel are disposed to overlap the non-emission area of the second sub-pixel.

7. The organic light emitting display device according to claim 1, wherein the bank layer includes a hydrophilic bank layer covering edges of the anodes and made of a hydrophilic material and a hydrophobic bank layer extending in a major axis direction and made of a hydrophobic material.

8. The organic light emitting display device according to claim 7, wherein the hydrophobic bank layer includes a protrusion which overlaps a part of the hydrophilic bank layer located in the non-emission area of the second sub-pixel.

9. The organic light emitting display device according to claim 7, further comprising:
an outer bank layer surrounding the plurality of sub-pixels; and
an auxiliary bank layer disposed to be in contact with an inner side surface of the outer bank layer and made of a hydrophilic material.

10. The organic light emitting display device according to claim 8, wherein the non-emission area of the second sub-pixel includes a groove made by the hydrophobic bank layer and having a shorter minor axis length than the emission area of the second sub-pixel.

11. An organic light emitting display device, comprising:
a plurality of sub-pixels including a first sub-pixel, a second sub-pixel, and a third sub-pixel;
an anode disposed in each of the plurality of sub-pixels;
a bank layer covering an edge of the anode and defining emission areas;
an organic emission layer on the anode; and
a cathode on the organic emission layer,
wherein each of the first sub-pixel, the second sub-pixel, and the third sub-pixel includes a respective one of the emission areas and a respective non-emission area, and
a minor axis length of the emission area in the first sub-pixel, a minor axis length of the emission area in the second sub-pixel, and a minor axis length of the emission area in the third sub-pixel are identical to each other, and
a major axis length of the emission area in the first sub-pixel, a major axis length of the emission area in the second sub-pixel, and a major axis length of the emission area in the third sub-pixel are different from each other, wherein the cathode of the first sub-pixel, the second sub-pixel, and the third sub-pixel is provided as a single continuous layer, and the organic light emitting display device further includes a low-potential voltage line for applying a low-potential voltage to the cathode, and the cathode is electrically connected to the low-potential voltage line in the non-emission area of the second sub-pixel.

12. The organic light emitting display device according to claim 11, wherein a contact area where the cathode is in contact with the low-potential voltage line is surrounded by the emission area of the first sub-pixel, the emission area of the second sub-pixel, and the emission area of the third sub-pixel.

13. An organic light emitting display device comprising:
a first pixel and a second pixel each including a first sub-pixel, a second sub-pixel, and a third sub-pixel which are arranged sequentially in a minor axis direction;
an anode disposed in each of the first sub-pixel, the second sub-pixel, and the third sub-pixel;
a bank layer covering an edge of the anode and defining emission areas;
an organic emission layer on the anode; and
a cathode on the organic emission layer,
wherein each of the first sub-pixel, the second sub-pixel, and the third sub-pixel includes a respective one of the emission areas and a respective non-emission area, and
a minor axis length of the emission area in the first sub-pixel, a minor axis length of the emission area in the second sub-pixel, and a minor axis length of the emission area in the third sub-pixel are identical to each other, and
a major axis length of the emission area in the first sub-pixel, a major axis length of the emission area in the second sub-pixel, and a major axis length of the emission area in the third sub-pixel are different from each other, wherein the first pixel and the second pixel are adjacent to each other in a major axis direction and symmetrical to each other in shape, the organic light emitting display device further includes a low-potential voltage line arranged between the first pixel and the second pixel, and the low-potential voltage line is connected to the cathode, which is provided as a single continuous layer in the first pixel and the second pixel, in the non-emission area between the emission area of the second sub-pixel of the first pixel and the emission area of the second sub-pixel of the second pixel.

14. The organic light emitting display device according to claim 13, wherein the low-potential voltage line includes a contact area which protrudes toward both of the first pixel and the second pixel.

* * * * *